United States Patent Office 3,563,742

Patented Feb. 16, 1971

3,563,742

NOVEL PHOTOSENSITIVE ELEMENTS AND PROCESSES

Georges A. Phlipot and Simone J. Kempen, Vincennes, France, assignors to Eastman Kodak Company, Rochester, N.Y., a corporation of New Jersey No Drawing. Filed Nov. 28, 1967, Ser. No. 686,313
Claims priority, application France, May 3, 1967, 104,991
Int. Cl. G03c *1/70, 11/12*
U.S. Cl. 96—28 15 Claims

ABSTRACT OF THE DISCLOSURE

Photographic images can be prepared by exposing to actinic radiation a composition comprising a film-forming binder, a polymerizable monomer, a photodegradable inhibitor which inhibits the polymerization of the monomer and a sensitizing dye which upon photo-exposure catalyzes the photodegradation of the inhibitor and then developing an image by solvent development or thermal transfer.

This invention relates to novel photosensitive compositions and elements and to novel photographic and photothermographic processes utilizing such elements.

It is known to use photopolymerizable compounds to prepare photosensitive elements comprising a layer of a dispersion of an unsaturated monomer and a polymerization catalyst in a binder coated on a photographic support. Among the monomers known in the prior art, acrylamide and its derivatives may be cited; in particular N,N'-methylene-bis-acrylamide is described as a photopolymerizable compound in French Pat. 1,427,567 and in U.S. Pat. 3,183,094. The systems described in these patents depend upon the generation by photo-exposure of a compound which catalyzes the polymerization of the monomer.

Also known are thermographic processes for the reproduction of documents in which two or more chemical compounds can react under the action of heat to give a colored image.

Photothermographic processes for the reproduction of documents are also known which utilize photosensitive materials comprising a photosensitive compound polymerizable by the action of light and which, in the unexposed areas, can be softened by the action of heat and can give an image by transfer. Such a process is described in U.S. Pat. 3,150,702.

It is an object of this invention to provide a novel photosensitive composition which can be polymerized in photo-exposed areas.

It is a further object of this invention to provide a novel photosensitive element containing a coating which can be polymerized in photo-exposed areas.

It is another object of this invention to provide a novel photographic process for preparing photographic images.

These and other objects and advantages of this invention will become apparent from the further description of the invention which follows.

In accordance with the invention there are provided novel photopolymerizable compositions comprising a film-forming binder, a polymerizable unsaturated monomer, a photodegradable inhibitor which inhibits the polymerization of the monomer and a photosensitizing dye which upon actinic exposure catalyzes the photodegradation of the inhibitor.

The novel photosensitive elements of our invention comprise a support on which is coated a layer of a photosensitive composition such as is described above.

The novel photographic reproduction process according to the invention comprises exposing imagewise a photosensitive element according to the invention, such as previously defined, to actinic radiation of sufficient intensity to degrade imagewise at least part of the photodegradable inhibitor, polymerizing the unsaturated monomer in the light exposed areas of the photosensitive element and producing a visible image by means of the differences in the properties between the non-polymerized areas and the polymerized areas. For example, it is possible to obtain a visible image negative with respect to the original by washing off with a solvent the unexposed and unpolymerized areas; or a visible image positive with respect to the original can be obtained by transferring with heat treatment onto a receiving sheet the unexposed and unpolymerized areas. The monomer can be polymerized in any known manner, for instance by subjecting it to the action of heat and/or to the action of free radicals.

As mentioned above, the novel photosensitive compositions according to the invention comprise (I) a polymerizable unsaturated monomer, (II) a photosensitizing dye, (III) a film-forming binder and (IV) a photodegradable inhibitor which inhibits the polymerization of the monomer.

Included among the polymerizable unsaturated monomers useful according to the invention are monomers that polymerize rapidly (in a few seconds) merely by heating them without any special precautions, substantially without going through the liquid state. Suitable monomers include the alkylene acrylamide monomers such as hexahydro-1,3,5-trisacrylyltriazine, N,N'-methylene-bis-acrylamide or N,N'-methylene-bis-methacrylamide. Such alkylene acrylamide monomers are crystalline compounds. N,N'-methylene-bis-acrylamide for instance melts at 187° C. and hexahydro-1,3,5-trisacrylyltriazine melts at about 170° C. According to the invention it is also possible to use mixtures of these alkylene acrylamide monomers, and also mixtures of alkyleneacrylamide monomers with other monomers which are not as readily polymerizable, such as acrylamide or methacrylamide monomers, and the like. Such other monomers can represent from 0 to 50% by weight of the polymerizable monomers present in the composition.

As mentioned above, the alkylene acrylamide monomers useful according to the invention are rapidly polymerizable merely by heating them without any special precautions. Generally they are preferably heated to a temperature near their melting temperature, for instance at about 170° C. for hexahydro-1,3,5-trisacrylyltriazine. It is also possible to polymerize them at a much lower temperature, for instance at room temperature, by using polymerization catalysts. Such polymerization catalysts can be free radical generating compounds that do not oxidize the inhibitor. For example, redox systems can be used such as a sodium metabisulfite-sodium persulfate system or an ammoniacal ferrous sulfate-hydrogen peroxide system.

Such alkylene acrylamide monomers are generally soluble in a variety of organic solvents. Thus, hexahydro-1,3,5-trisacrylyltriazine is soluble in halogenated hydrocarbon solvents such as methylene chloride and N,N'-methylene-bis-acrylamide is soluble in ketones, such as acetone, methyl ethyl ketone and cyclohexanone. Finally, these monomers are slightly soluble in water.

Among the photodegradable inhibitors which are useful according to the invention to inhibit the polymerization of the above described monomers, there are preferably employed naphthol inhibitors such as 4-methoxy-alpha-naphthol, 1,4-naphthalenediol, 1,5-naphthalenediol, etc., and thiocarbonic acid derivatives such as allylthiourea and thiourea. These inhibitors are degraded by an oxidation reaction which is catalyzed by the action of light.

Included among the photosensitizing dyes which are useful in the invention to activate the photodegradation of the polymerization inhibitors, are xanthene dyes such as erythrosine, thiazine dyes such as methylene blue, triphenylmethane dyes such as fuchsine and crystal violet, azine dyes such as safranine, pyrylium salts, thiapyrylium salts, etc.

The polymeric film-forming binders useful in the invention should be selected from among oxygen-permeable compositions, since the inhibitor is degraded by photooxidation. They should be thermoplastic when employed in those embodiments in which an image positive with respect to the original is developed by transfer with heat treatment.

When the binder employed is soluble in organic solvents, the image can be developed by a wash off operation in an organic solvent such as methylene chloride or acetone, and when the binder employed is water soluble, the image can be developed by washing off with water. Finally, these binders should be permeable to water when a redox system, such as those mentioned above, is used to catalyze the polymerization reaction.

Included among the binders useful in the invention are gelatin and polyolefins including polyvinyl resins such as polyvinyl acetatebutyral, polyvinyl acetate, polyvinyl pyridine, and polyvinyl alcohol. Polyvinyl pyridine is preferably used when the monomer is polymerized by heat, and gelatin is preferred when the polymerization of the monomer is catalyzed by a redox system such as described above.

The polymerizable unsaturated monomers useful in the invention, in particular alkylene acrylamide monomers such as hexahydo-1,3,5-trisacrylyltriazine, have the property of being very rapidly polymerized into a three-dimensional non-fusible mass which is insoluble in most organic solvents, when heated to a temperature near their melting temperature.

It was found, according to the invention, that these monomers when they are rapidly heated for a short time in the presence of the above-mentioned inhibitors melt without being polymerized and, upon cooling, return to the starting monomers which are still soluble in solvents such as methylene chloride and acetone. Such inhibitors, therefore, prevent the polymerization of the monomers.

The above-mentioned inhibitors are degraded by the action of light and such photodegradation of the inhibitors can be activated by certain compounds, in particular by the aforementioned photosensitizing dyes. Thus, the polymerization of the monomers useful in the invention is possible in the exposed areas of the photopolymerizable elements of the invention, while in the unexposed areas polymerization is inhibited.

The supports on which the novel photosensitive compositions of the invention can be coated may be any usual photographic support which is not adversely affected by the heat applied during the heat treatment of the photopolymerizable materials of the invention. Such supports include paper, polyethylene coated paper, metal foils and plates, polymeric resin films such as cellulose triacetate film, cellulose acetate butyrate film, polyester film, such as a polyethylene terephthalate film, etc. A paper support is preferred.

To prepare the photosensitive elements of the invention, a layer of a photosensitive composition according to the invention is coated by any known process onto one of the above described supports at a dry thickness of more than 5 microns, the wet thickness being advantageously in the range of from 0.04 mm. to 0.3 mm.

The proportions of the various components in the photopolymerizable composition of this invention can vary over a wide range. Typically useful results are obtained when the inhibitor is present in amounts of from about 0.01% to about 5% by weight of the monomer present. Preferably the inhibitor is present in amounts of from about 0.05% to 0.1% by weight of monomer. The dye can be present in amounts of from about 0.01% to about 0.5% by weight of the monomer present in the composition. Typical coatings are prepared with a monomer to binder weight ratio of from about 1:0.25 to about 1:5.

When the polymerization of the monomer is carried out in the presence of a catalyst of the redox system type, the reducing agent can be incorporated in the photosensitive layer. For instance, sodium metabisulfite or ferrous sulfate can be incorporated in said layer if one of the aforementioned oxidizing-reducing combinations is used.

In a specific embodiment of the photographic reproduction process according to the invention, a photosensitive element made according to the invention is exposed to actinic radiation through a graphic original on a transparent film. The photodegradable inhibitor is destroyed in the photoexposed areas of the photosensitive element. The monomer contained in the photoexposed areas then can be polymerized by heating the photosensitive layer at an elevated temperature near the melting point of the monomer or of the mixture of monomers, for instance at a temperature of about 170° C. The photosensitive element subjected to this treatment carries two images, i.e., a polymerized resin image which is negative with respect to the original, and an unpolymerized monomer image which is positive with respect to the original. The image can be developed by either of two different procedures, either by a wash-off operation or by thermal transfer.

In one development procedure there is obtained the negative image only. When the monomer is dispersed in a binder which is soluble in organic solvents, it suffices to dissolve at room temperature the dispersion of unpolymerized monomer in an organic solvent, such as methylene chloride or acetone, which does not dissolve the negative image of polymerized resin. When a monomer dispersed in a water soluble binder is used, the unexposed unpolymerized areas can be washed off with hot water to render the negative image of polymerized resin visible.

In another development procedure the positive image of unpolymerized monomer can be separated from the negative polymerized resin image. The photosensitive layer is applied, after polymerization, with pressure against a receiving sheet or element and the positive image of melted monomer is transferred thereto. After a few seconds of contact, the two sheets are separated and a negative image is obtained on the photosensitive element while a positive image of the original is obtained on the receiving sheet. If the thickness of the photosensitive layer is sufficient, several successive transfers can be effected.

In another embodiment of the photographic reproduction process according to the invention, a photosensitive element is exposed as indicated above, then the polymerization of the monomer contained in the photoexposed areas (the areas in which the polymerization inhibitor was degraded by the action of light) is activated with a free radical generating catalyst. The photosensitive element thus treated can be washed with a solvent to give a negative image, or contacted with a receiving sheet to produce a positive image. In this embodiment, the wash off operation with a solvent is preferred since it avoids heating the photosensitive element to an elevated temperature. The photosensitive element is only heated during the polymerization period at a relatively moderate temperature because of the presence of the free radical generating catalyst. This temperature can be in the range of from 1° C. to 35° C. When gelatin is used as the binder, the wash off solvent can be water and the wash off temperature can be in the range of from 35° C. to 100° C.

The alkylene acrylamide monomers useful in the invention have been already described in the literature. An example of a method for preparing hexahydro-1,3,5-trisacrylyltriazine is given hereunder.

PREPARATION OF HEXAHYDRO-1,3,5-TRISACRYLYLTRIAZINE

The method used is derived from the procedure described by Gresham and Steadman in Journal of the American Chemical Society (1949) p. 1872. A mixture of 200 ml. of freshly distilled acrylonitrile and 4 ml. of concentrated sulfuric acid is boiled with stirring. A dispersion of 90 g. of trioxymethylene in 120 ml. of purified benzene is then added portionwise, the addition being rapid enough to maintain the temperature at 80° C. At the end of the addition, the mixture is cooled suddenly in cracked ice, and the benzene solution is filtered. The crystals are washed with cold water containing sufficient sodium hydroxide to neutralize the sulfuric acid used as a catalyst. They are then rinsed with cold water until rendered neutral. These crystals are immediately redissolved in hot alcohol and the alcohol solution is immediately cooled with Dry Ice. The resulting crystals are filtered, then dried under nitrogen to avoid any peroxide formation.

This invention is further illustrated by the following examples.

Example 1

The following mixture was placed in a ball-mill:

Hexahydro-1,3,5-trisacrylyltriazine: 10 g.
4-methoxy-alpha-naphthol: 5 mg.
Erythrosine: 1.5 mg.
5% solution of poly - 2 - vinylpyridine in isopropyl alcohol: 50 ml.

The mixture was milled for 12 hours, then knife coated on a baryta paper support. The wet thickness of the photosensitive layer was 0.2 mm. After drying, the layer was exposed for 3 to 5 minutes through a photographic positive on a transparent film at a distance of 8 cm. to twelve 16 watt low pressure mercury vapor lamps arranged in a parallel direction of 6 cm. from each other. The polymerization of the monomer contained in the photoexposed areas was carried out by heating the photosensitive layer for a few seconds on a plate at 170° C. The photosensitive material was then placed with its sensitive side in contact with a paper receiving sheet and the sandwich was heated with pressure at a temperature of about 170° C. The two paper sheets were separated while still hot. The paper receiving sheet carried a relief positive image formed by the transferred melted monomer.

Example 2

The following mixture was dispersed in a ball-mill as in Example 1.

Hexahydro-1,3,5-trisacrylyltriazine: 10 g.
4-methoxy-alpha-naphthol: 5 mg.
2,6-bis-p-methoxyphenyl-4-p-n-amyloxyphenyl-thiapyrylium perchlorate: 30 mg.
5% solution of poly-2-vinylpyridine in a 50:50 mixture of ethyl alcohol and isopropyl alcohol: 50 ml.

The resulting mixture was coated on baryta paper as in Example 1. The photosensitive layer was exposed through a line photographic negative for 2 minutes 30 seconds to a 500 w. tungsten lamp placed at 25 cm. from the negative. The monomer in the exposed areas was polymerized by heating at 170° C. as in Example 1. The photosensitive material was developed by washing off the unpolymerized (unexposed) areas with methylene chloride and a relief image positive with respect to the original was obtained. When the amount of thiapyrylium salt was decreased to 10 mg. (instead of 30 mg.) and the exposeure time was decreased to 15 seconds, a good positive relief image was also obtained.

Example 3

The procedure of Example 1 was repeated, but erythrosine was replaced by an identical amount of methylene blue. Exposure was carried out as in Example 2, but the original was a positive and the exposure time was 5 minutes. Polymerization was effected at 170° C. as in Example 2, and transfer was carried out with heat treatment as in Example 1 onto a 40 g./m.$^2$ document paper. A good positive image of the original was obtained. When this procedure was repeated, but with erythrosine replaced by identical amounts of fuchsine, crystal violet and safranine, the exposure times required to obtain a good image were respectively 30 minutes, 12 minutes and 4 minutes.

Example 4

A photosensitive layer was prepared as in Example 1. This layer was exposed and the exposed areas were polymerized as in Example 1. Then transfer was carried out as in Example 1 but using a lithographic master sheet as the receiving sheet. A lithographic plate for use on an offset press was thus obtained.

Example 5

The following mixture was dispersed in a ball-mill.

Hexahydro-1,3,5-trisacrylyltriazine: 5 g.
Allythiourea: 50 mg.
Erythrosine: 1 mg.
Solution of poly-2-vinylpyridine in isopropanol (5%): 25 ml.

This dispersion was coated on baryta paper as in Example 1, then dried and exposed through a line positive transparancy for 5 minutes to a tungsten lamp placed at 25 cm. from the original. Polymerization was effected and transfer was carried out with heat treatment as in Example 1. A positive image of the original was obtained.

Example 6

The procedure of Example 5 was repeated, but allylthiourea was substituted by thiourea. A positive image of the original was obtained.

Example 7

The procedure of Example 5 was repeated, but allylthiourea was substituted by 1,4-naphthalenediol. A positive image of the original was obtained.

Example 8

The following mixture was dispersed in a ball-mill as in Example 1.

N,N′-methylene-bis-acrylamide: 1 g.
4-methoxy-alpha-naphthol: 6 mg.
Erythrosine: 1 mg.
10% solution of poly-2-vinylpyridine in isopropanol: 3 ml.

The resulting dispersion was coated on baryta paper at a wet thickness of 0.3 mm. The photosensitive layer was dried, then exposed for 10 minutes through a photographic negative by the procedure of Example 2. The monomer in the exposed areas was polymerized by heating the layer for 30 seconds at about 170° C. A positive image was then made visible by washing the unexposed areas with a cotton swab soaked in acetone and a positive relief image was obtained which could be used as a lithographic master plate. When the binder of the photosensitive layer had a rather low oxygen permeability, the exposure time of the photosensitive material had to be increased for the photodegradation of the inhibitor (by oxidation by aerial oxygen) to be complete. The same held true with gelatin which is less permeable to oxygen than poly-2-vinylpyridine.

Example 9

The following solution was prepared:

Acrylamide: 0.25 g.
N,N′-methylene-bis-acrylamide: 0.25 g.
4-methoxy-alpha-naphthol: 10 mg.
Erythrosine: 1.5 mg.
Gelatin (10% solution): 25 ml.

This solution was knife coated on baryta paper at a wet thickness of 0.05 mm. to give a dry thickness of 5 microns. The photosensitive layer was dried, then exposed for 15 minutes through a photographic negative to a 500 w. over-run lamp placed at 25 cm. from the negative. The mixture of monomers was then polymerized in the exposed areas by dipping the exposed photosensitive material at room temperature in a 10% solution of ammoniacal ferrous sulfate ($FeSO_4 \cdot 7H_2O$) for 2 seconds, then in a 10% solution of hydrogen peroxide for 2 seconds. The exposed areas were thus hardened and could be made visible by washing off the unexposed areas with hot water (35° C. to 100° C.). A positive image was obtained.

Example 10

The following solution was prepared:

N,N'-methylene-bis-acrylamide: 1 g.
4-methoxy-alpha-naphthol: 10 mg.
Erythrosine: 3 mg.
Gelatin (10% solution): 25 ml.

This solution was coated on baryta paper as in Example 9 and the exposure and development procedures of that example were repeated. A positive image was obtained from the negative original.

The following example describes a photopolymerizable element whose photosensitive layer contains an incorporated reducing agent which is one of the components of the redox system used as a polymerization catalyst.

Example 11

To the solution prepared in Example 10 there was added 0.1 g. of ferrous sulfate ($FeSO_4 \cdot 7H_2O$). The solution then was coated on baryta paper at a wet thickness of 0.05 mm. The photosensitive layer was dried, then exposed for 30 minutes through a photographic negative to a 500 w. over-run lamp placed at 25 cm. from the negative. To polymerize the mixture of monomers of Example 10, the element was dipped for a few seconds in a 10% hydrogen peroxide solution at room temperature. A positive image was made visible by washing off the unexposed areas with hot water at about 60° C.

The invention has been described in detail with particular reference to preferred embodiments thereof, but it will be understood that variations and modifications can be effected within the spirit and scope of the invention as described hereinabove and as defined in the appended claims.

We claim:

1. A photographic element comprising a support bearing a layer of a photosensitive composition which comprises a film-forming, oxygen-permeable binder, a polymerizable alkylene acrylamide monomer, a photodegradable naphthol inhibitor which inhibits polymerization of the monomer and a photosensitizing dye which upon actinic exposure catalyzes the photodegradation of the inhibitor without catalyzing photopolymerization of the monomer.

2. An element of claim 1 wherein the binder is gelatin.

3. An element of claim 1 wherein the binder is a polyolefin.

4. An element of claim 1 wherein the binder is poly-2-vinylpyridine.

5. An element of claim 1 wherein the alkylene acrylamide monomer is N,N'-methylene-bis-acrylamide.

6. An element of claim 1 wherein the alkylene acrylamide monomer is hexahydro-1,3,5-trisacrylyltriazine.

7. An element of claim 1 wherein the photodegradable polymerization inhibitor is 4-methoxy-alpha-naphthol.

8. An element of claim 1 wherein the sensitizer dye is a thiapyrylium dye salt or erythrosine.

9. A photographic element comprising a support bearing a layer of a photosensitive composition which comprises a poly-2-vinylpyridine binder, a hexahydro-1,3,5-trisacryltriazine polymerizable monomer, a 4-methoxy-alpha-naphthol inhibitor and a thiapyrylium dye salt sensitizer.

10. A photographic element comprising a support bearing a layer of a photosensitive composition which comprises a gelatin binder, a N,N'-methylene-bis-acrylamide polymerizable monomer, a 4-methoxy-alpha-naphthol inhibitor and an erythrosine sensitizer.

11. A process for the preparation of a photographic image which comprises the steps of (a) imagewise exposing to actinic radiation a photosensitive element comprising a support bearing a layer of a photosensitive composition which comprises a film-forming, oxygen-permeable binder, a polymerizable alkylene acrylamide monomer, a photodegradable napthol inhibitor which inhibits polymerization of the monomer and a photosensitizing dye which upon actinic exposure catalyzes the the photopolymerization of the monomer, the exposure being sufficient to degrade at least a portion of the inhibitor in the exposed area without polymerizing the monomer, (b) polymerizing the unsaturated monomer in exposed areas, and (c) developing a relief image by removing the composition from unexposed areas of the element.

12. A process of claim 11 wherein polymerization is effected by heating the element to a temperature sufficient to cause thermal polymerization of the monomer.

13. A process of claim 11 wherein polymerization is effected by treating the element with a free radical generating catalyst.

14. A process of claim 11 wherein development is effected by washing the element with a solvent for the composition in unexposed areas which is a non-solvent for the polymerized composition in exposed areas.

15. A process of claim 11 wherein development is effected by heating the element to soften the composition in unexposed areas and transferring composition from unexposed areas of the element to a receiving sheet.

References Cited

UNITED STATES PATENTS

| | | | |
|---|---|---|---|
| 3,452,182 | 6/1969 | Haas | 96—115P |
| 3,060,026 | 10/1962 | Heiart | 96—28 |
| 3,255,000 | 6/1966 | Gates et al. | 96—111 |
| 3,060,025 | 10/1962 | Burg et al. | 96—28 |
| 3,075,907 | 1/1963 | Levinos | 96—35.1 |
| 3,255,004 | 6/1966 | Thommes | 96—35.1 |
| 3,279,919 | 10/1966 | Laridon et al. | 96—35.1 |

WILLIAM D. MARTIN, Primary Examiner

M. SOFOCLEOUS, Assistant Examiner

U.S. Cl. X.R.

96—35.1, 115, 48